(12) United States Patent
Vincent

(10) Patent No.: US 10,354,958 B2
(45) Date of Patent: Jul. 16, 2019

(54) THROUGH PACKAGE CIRCUIT IN FAN-OUT WAFER LEVEL PACKAGE

(71) Applicant: Michael B. Vincent, Chandler, AZ (US)

(72) Inventor: Michael B. Vincent, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 697 days.

(21) Appl. No.: 14/503,962

(22) Filed: Oct. 1, 2014

(65) Prior Publication Data

US 2016/0099212 A1  Apr. 7, 2016

(51) Int. Cl.

| | |
|---|---|
| *H01L 21/311* | (2006.01) |
| *H01L 23/538* | (2006.01) |
| *H01L 21/56* | (2006.01) |
| *H01L 23/00* | (2006.01) |
| *H01L 25/16* | (2006.01) |
| *H01L 25/03* | (2006.01) |
| *H01L 23/498* | (2006.01) |
| *H01L 23/552* | (2006.01) |

(52) U.S. Cl.
CPC ........ *H01L 23/5389* (2013.01); *H01L 21/561* (2013.01); *H01L 23/49827* (2013.01); *H01L 23/5382* (2013.01); *H01L 23/5384* (2013.01); *H01L 24/19* (2013.01); *H01L 24/96* (2013.01); *H01L 24/97* (2013.01); *H01L 25/03* (2013.01); *H01L 25/16* (2013.01); *H01L 21/568* (2013.01); *H01L 23/49816* (2013.01); *H01L 23/552* (2013.01); *H01L 2224/04105* (2013.01); *H01L 2224/12105* (2013.01); *H01L 2224/24137* (2013.01); *H01L 2224/24195* (2013.01); *H01L 2924/14* (2013.01); *H01L 2924/19041* (2013.01); *H01L 2924/19042* (2013.01); *H01L 2924/19043* (2013.01); *H01L 2924/19105* (2013.01); *H01L 2924/3025* (2013.01)

(58) Field of Classification Search
CPC ...................... H01L 23/5389; H01L 21/31127
See application file for complete search history.

(56) References Cited

U.S. PATENT DOCUMENTS

| | | | |
|---|---|---|---|
| 7,838,420 B2 | 11/2010 | Tang et al. | |
| 8,680,683 B1 | 3/2014 | Juskey et al. | |
| 2013/0049182 A1 | 2/2013 | Gong et al. | |
| 2013/0049217 A1 | 2/2013 | Gong et al. | |
| 2013/0049218 A1 | 2/2013 | Gong et al. | |
| 2014/0035892 A1 | 2/2014 | Shenoy et al. | |
| 2015/0318263 A1* | 11/2015 | Yu | H01L 23/36 257/774 |
| 2015/0380386 A1* | 12/2015 | Vincent | H01L 25/50 257/773 |

* cited by examiner

*Primary Examiner* — Thomas L Dickey

(57) ABSTRACT

A method and apparatus are provided for manufacturing a packaged electronic device (3) having pre-formed and placed through package circuit devices (35) which include an embedded circuit component (39) and conductor terminals (37A, 37B) extending from a molded package (38) embedding the circuit component (39). The through package circuit devices (35) are placed on end with integrated circuit die (34) and encapsulated in a molded device package (32) which leaves exposed the one or more conductor terminals (37A, 37B) positioned on first and second surfaces of the through package circuit device, where the conductor terminals (37A, 37B) and embedded circuit component (39) form a circuit path through the molded device package.

20 Claims, 7 Drawing Sheets

THROUGH PACKAGE CIRCUIT IN FAN-OUT WAFER LEVEL PACKAGE

BACKGROUND OF THE INVENTION

Field of the Invention

The present invention is directed in general to integrated circuit packages and methods of manufacturing same. In one aspect, the present invention relates to an integrated circuit package having through-package circuit connections between opposed sides of encapsulated device packages.

Description of the Related Art

Integrated circuit devices and other types of electronic devices are often encapsulated with molding compound or resin to provide environmental protection and facilitate external connection to the devices. Subsequent to encapsulation, interconnect structures can be built up on one or both sides of the encapsulated devices. For packages having electrical contacts on both top and bottom surfaces, through package vias (TPV) or pre-placed vias (PPV) are typically used to make direct electrical connection between opposed top and bottom side interconnect structures on the package. However, conventional TPV structures are made using an expensive drilling-based process either before or after encapsulation (e.g., laser drilling, metallization filling, polishing, taping, and so on) that introduces complexities to the manufacturing process that have a variety of manufacturing and reliability challenges (e.g., consistent integrity of the through via and reliable connection to the interface). In addition, there are costs associated with the materials, processes, and additional tooling required to form TPV structures which are typically filled with silver particles. There are also challenges to reducing the size and density of TPV and PPV structures due to limitations in the pitch and aspect ratio of structures formed by laser drilling through mold compounds and/or filling high aspect ratio holes with conductive material. For example, FIG. 1 depicts an example integrated circuit package device 1 in which an encapsulant 12 surrounds an integrated circuit die 14 and includes a through package via structure 15 formed to connect first and second interconnect structures 11, 13 on opposite sides of the encapsulant 12. Such conventional TPV structures 15 may have a minimum pitch of 180 um between 100 um diameter holes. As a result, the existing solutions for providing high density through-package via circuit connections are extremely difficult at a practical level.

BRIEF DESCRIPTION OF THE DRAWINGS

The present invention my be understood, and its numerous objects, features and advantages obtained, when the following detailed description is considered in conjunction with the following drawings.

DETAILED DESCRIPTION

A method and apparatus are described for fabricating and packaging one or more integrated circuit die by forming and encapsulating one or more through package circuits with one or more integrated circuit die to form a package device in which the through package circuit(s) provide signal-bearing pathways between interconnects or contacts on the bottom and top of the package device. In selected embodiments, photolithographic processing techniques are used to define plated metal or routing conductor layers on a packaged panel of circuit components which is singulated into individual through package circuits (TPCs) which may be encapsulated in mold compound with other integrated circuit die using a fan-out wafer level packaging scheme to provide packaged devices with fine pitch through package interconnect routing on a vertical plane that can provide additional circuit functions at reduced cost and processing complexity. In selected embodiments, the through package circuits (TPCs) may be formed by encapsulating a panel of circuit components in a mold compound or otherwise forming one or more conductor lines over a substrate, building up interconnect structures over the encapsulated panel/substrate which include conductors that electrically connect the circuit components to fine pitched plated conductor lines extending laterally over the encapsulated panel/substrate, and then singulating the encapsulated panel/substrate into individual TPCs. On a carrier substrate, one or more individual TPCs may then be placed on end and encapsulated with an integrated circuit (IC) die in a mold compound to form an encapsulated TPC/IC panel such that the fine pitched plated conductor lines from the TPCs are exposed on opposed first and second sides. On one or both of the first and second sides of the encapsulated TPC/IC panel, interconnect structures are built, alone or in combination with surface mount technology (SMT) circuits or conductive shield layers, followed by singulation of the encapsulated panel/substrate to form individual packaged devices with TPCs that provide an electrical connection from circuitry or conductors on opposed sides of each packaged device.

Figure 1:
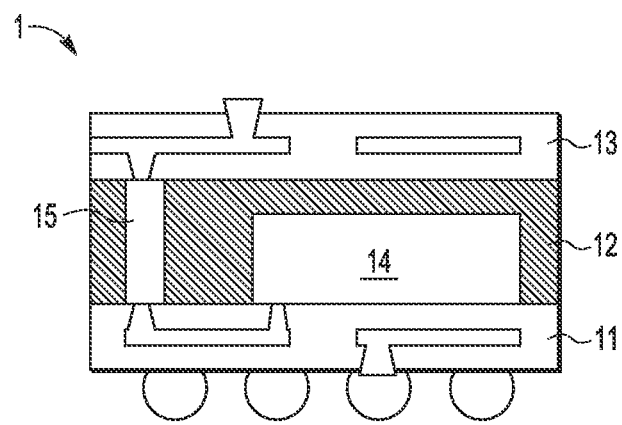
FIG. 1 is a cross-sectional view of an integrated circuit package device having a TPV structure for connecting interconnect structures formed on opposite sides of the package device.
Figure 2:
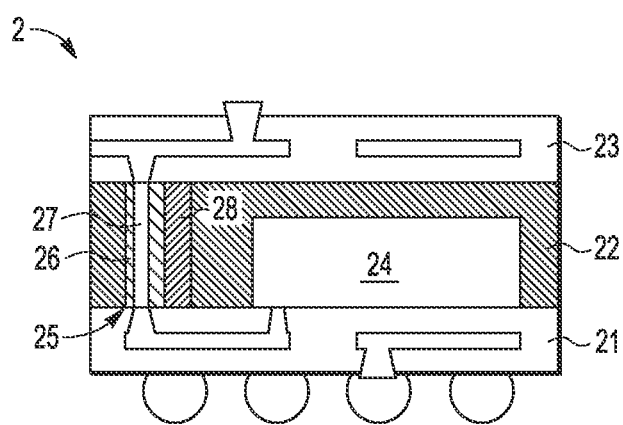
FIG. 2 is a cross-sectional view of an integrated circuit package device having a through package circuit for connecting interconnect structures formed on opposite sides of the package device in accordance with selected embodiments of the present disclosure.

Turning now to FIG. 2, there is shown a simplified cross-sectional view of an integrated circuit package device 2 having an integrated circuit die 24 and through package circuit 25 which are at least partly encapsulated by a mold compound body 22 in accordance with selected embodiments of the present disclosure. As described herein, the depicted through package circuit 25 is an integrated circuit component that is formed with a planar fabrication process to include a substrate 28 on which dielectric or insulator layers 26 and conductor layers 27 are sequentially formed. The substrate 28 may be formed with a semiconductor wafer (e.g., silicon) or other substrate structure. On a first surface of the substrate 28, one or more dielectric or insulator layers 26 and conductor layers 27 are deposited, patterned, and etched to form an interconnect structure in which fine pitch patterned conductor layers 27 provide one or more signal conduits across the through package circuit 25. After placing the through package circuit 25 on its side for encapsulation with the integrated circuit die 24 in the mold compound body 22, first and interconnect structures 21, 23 are formed on opposite sides of the encapsulating mold compound body 22 by depositing, patterning, and etching one or more dielectric or insulator layers and conductor layers. As a result, the fine pitch patterned conductor layers 27 provide signal conduits pathways between interconnects or contacts on the bottom and top of the integrated circuit package device 2. By forming the interconnect structure 26-27 using photolithographic processes to pattern and define fine pitch patterned conductor layers 27, the resulting through package circuits 25 may include patterned conductor layers 27 having 15 um widths with pitches well below 100 um (e.g., approximately 35 um).

Figure 3:
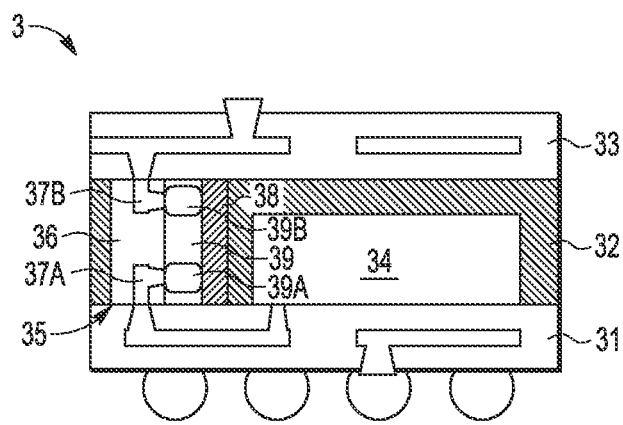
FIG. 3 is a cross-sectional view of an integrated circuit package device having a through package circuit with an embedded component for connecting interconnect structures formed on opposite sides of the package device in accordance with selected embodiments of the present disclosure.

FIG. 3 is a simplified cross-sectional view of an integrated circuit package device 3 having an integrated circuit die 34 and through package circuit 35 with an embedded component 39 which are at least partly encapsulated by a mold compound body 32 accordance with selected embodiments of the present disclosure. The depicted through package circuit 35 is a component that is formed with a planar fabrication process by at least partially encapsulating the embedded component 39 with a mold compound body 38 (e.g., with an epoxy molding compound) to leave exposed first and second terminals 39A, 39B of the embedded component 39, and then sequentially forming dielectric or insulator layers 36 and conductor layers 37. For example, one or more dielectric or insulator layers 36 and conductor layers 37 may be deposited over a first surface of the mold compound body 38, and then patterned and etched to formed an interconnect structure in which fine pitch patterned conductor layers 37A. 37B are connected to the first and second terminals 39A, 39B to provide one or more signal conduit paths through the embedded component 39 and across the through package circuit 35. With the through package circuit 35 placed on its side and encapsulated with the integrated circuit die 34 in the mold compound body 32, first and interconnect structures 31, 33 are formed on opposite sides of the encapsulating mold compound body 32 by depositing, patterning, and etching one or more dielectric or insulator layers and conductor layers. As a result, the fine pitch patterned conductor layers 37A, 37B provide signal conduits pathways which add circuit functionality (e.g., capacitance, resistance, inductance, or other passive or active circuit component functions) between interconnects or contacts on the bottom and top of the integrated circuit package device 3.

To illustrate an example sequence of process steps for fabricating a through package circuit with an embedded circuit component in accordance with selected embodiments of the present disclosure, reference is now made to FIGS. 4-9 which show diagrammatic depictions of various manufacturing process steps which may be used to form through package circuits from a panel of mold array packages formed by encapsulating a plurality of circuit components 102A-D.

Figure 4:
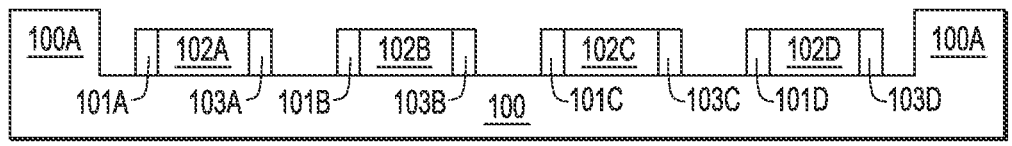
FIGS. 4-9 illustrate cross-sectional views of an example sequence of process steps for fabricating a through package circuit with an embedded component in accordance with selected embodiments of the present disclosure.

As depicted in FIG. 4, a carrier substrate or holder or panel 100, such as a glass substrate, is provided. In selected embodiments, the panel 100 includes a raised outer peripheral frame portion 100A which provides a mold frame function during subsequent processing steps. A plurality of circuit components 102A-D are attached to the panel 100 that have been inspected and attached in an array configuration using any appropriate attach method, such as an adhesive layer (not shown). Although any suitable method may be used to position the circuit components 102A-D onto the panel 100, in one embodiment, a conventional pick-and-place machine is used in positioning the circuit components 102A-D. As depicted, each circuit component (e.g., 102A) may include one or more connector terminals (e.g., 101A, 103A) so that the circuit components 102A-D may be any type of circuit, such as a capacitor, resistor, inductor, or other passive device, and may also include one or more active circuit components, such as one or more switching transistors or more complex circuits that perform any other type of function. Thus, the circuit components 102A-D are not limited to a particular technology and need not be derived from any particular wafer technology.

Figure 5:
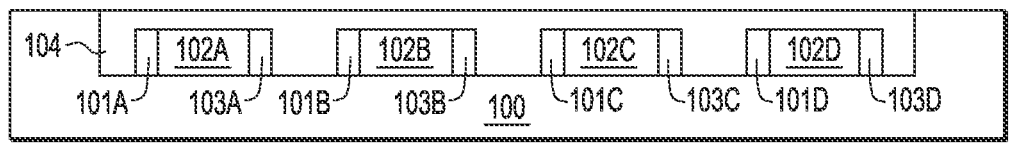

FIG. 5 illustrates a cross-sectional view of the panelized components 5 after additional processing is applied to encapsulate the circuit components in accordance with selected embodiments of the present disclosure. As depicted, a molding material is applied to cover the circuit components 102A-D affixed to panel 100, thereby forming an encapsulant or mold compound body 104 that encapsulates the circuit components 102A-D within the molding material and forms a panel. The molding material can be any appropriate encapsulant including, for example, silica-filled epoxy molding compounds, plastic encapsulation resins, and other polymeric materials such as silicones, polyimides, phenolics, and polyurethanes. The molding material can be applied by a variety of standard processing techniques used in encapsulation including, for example, printing, pressure molding, injection molding, film-assisted molding, and spin application. Once the molding material is applied the panel can be cured by exposing the materials to certain temperatures for a period of time, or by applying curing agents, or both. In a typical encapsulation process, a depth of encapsulant 104 can exceed a maximum height of the circuit components 102A-D being embedded, or could be at least the height of the connector terminals (e.g., 101A, 103A).

Figure 6:
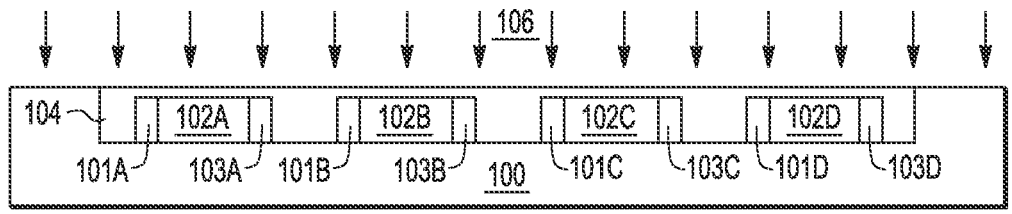

FIG. 6 illustrates a cross-sectional view of the encapsulated panel of circuit components 6 after additional processing is applied to the encapsulated panel 102A-D, 104 to achieve a desired panel thickness in accordance with selected embodiments of the present disclosure. As depicted, a grinding or etching process 106 may be applied to reduce the thickness of the encapsulant or mold compound body 104 to a desired panel thickness without exposing the ends of connector terminals (e.g., 101A, 103A). This reduction in thickness of the encapsulant 104 can be performed by a grinding process, chemical etching, laser ablation, or other conventional techniques back grinding), or alternatively by forming the encapsulant to the appropriate thickness during the encapsulation process. Though the grinding process 106 is shown as reducing the height of the raised outer peripheral frame portion 100A on the panel 100, this can be readily avoided by removing the raised outer peripheral portion or transferring the encapsulated panel of circuit components 102A-D to another carrier substrate prior to grinding. Alternatively, the panel 100 may be formed with glass plate and the raised outer peripheral frame portion 100A may be formed with a metal frame that is adhered to the glass plate to provide the sides of the mold which are removed for grinding. Though not shown, it will be appreciated that film-assisted molding may be used and controlled so that the tops of the connector terminals may be free of mold compound, thereby eliminating the need for grind processing and enabling electrical connections to both one or both sides of the encapsulated panel of circuit components.

Figure 7:
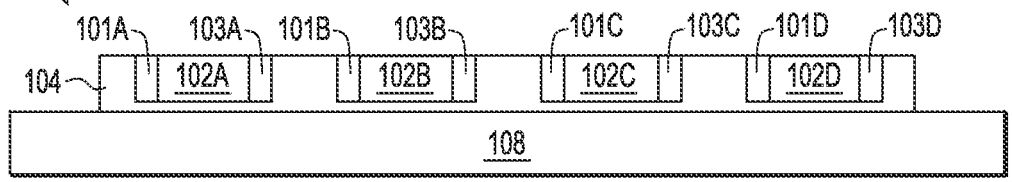

FIG. 7 illustrates a cross-sectional view of the panel of circuit components 7 after additional processing is applied to release, flip, and mount the panel of circuit components 102A-D, 104 on a new carrier substrate 108 in accordance with selected embodiments of the present disclosure. As a preliminary step, the encapsulated panel of circuit components 102A-D, 104 is removed or released from the substrate/holder/panel 100. Once released, the side of the panel previously attached to the substrate/holder/panel 100 may be cleaned to remove any adhesive and otherwise clear and expose the ends of connector terminals (e.g., 101A, 103A). At this point, the encapsulated panel of circuit components 102A-D, 104 is turned over or flipped and attached or mounted to a second process carrier substrate or holder or panel 200 using any appropriate attach method. As mounted, the connector terminals (e.g., 101A, 103A) for the each circuit component (e.g., 102A) are exposed on a top surface of the mounted panel of circuit components 102A-D, 104.

Figure 8:
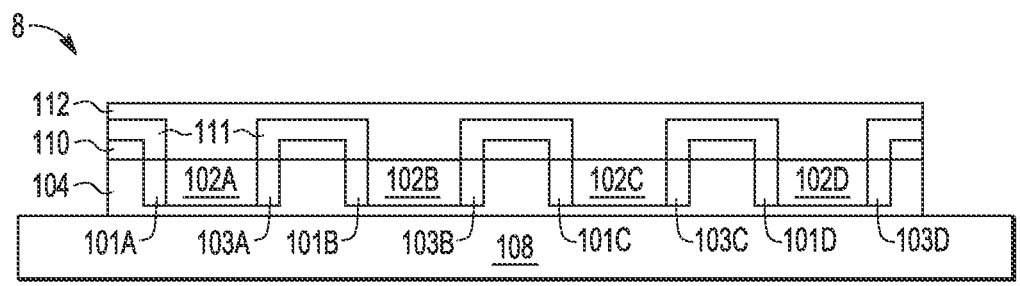

FIG. 8 illustrates a cross-sectional view of the panel of circuit components 8 after additional processing is applied to build up an interconnect structure 110-112 on the exposed surface of the panel of circuit components 102A-D, 104 in accordance with selected embodiments of the present disclosure. While the interconnect structure 110-112 may be formed with any desired combination of dielectric or insulator layers and patterned conductor layers, in selected embodiments, a first or top exposed surface of the panel of circuit components 102A-D, 104 is covered with at least a first insulating layer 110, such as by spin coating a polymeric (e.g., epoxy) resin as a dielectric layer. The first insulating layer 110 can be patterned and selectively etched or developed to form openings exposing the connector terminals 101A-D, 103A-D. Over the patterned first insulating layer 110, one or more conductive layers 113 may then be formed or deposited to form an interconnect conductor which is patterned and selectively etched to form the conductor layers 111 that provide one or more signal conduits to and from the embedded circuit components 102A-D. One or more additional insulating layers 112 may then be formed or deposited to cover the patterned conductor layers 111 as required by the application. By forming the interconnect structure 110-112 over the panel of circuit components 102A-D, 104 with a planar fabrication techniques, plated metallization layers can be defined as fine pitch patterned conductor layers which provide one or more signal conduits to the circuit components 102A-D. However, in embodiments where there are no embedded circuit components, the interconnect structure 110-112 may be formed on a semiconductor wafer (e.g., silicon) or other substrate structure by sequentially forming insulating and conductor layers which are patterned and etched to form fine pitch patterned conductor layers which extend across the exposed surface of the panel of circuit components 102A-D, 104.

Figure 9:
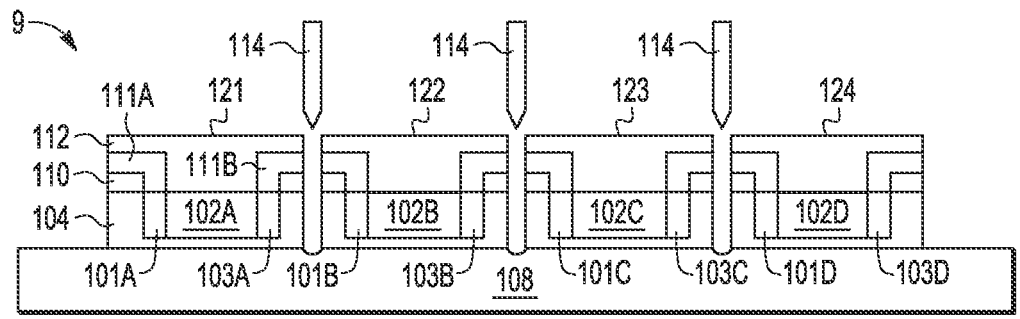

FIG. 9 illustrates a cross-sectional view of the panel of circuit components 9 after additional processing is applied to singulate the panel of circuit components 102A-D, 104 into individual through package circuits 121-124 in accordance with selected embodiments of the present disclosure. As will be appreciated, individual through package circuits 121-124 may be singulated with a saw or laser or other cutting device 114 that is applied along defined saw cut lines or scribe grids (not shown) to cut down through the interconnect structure 110-112 and encapsulated panel of circuit components 102A-D, 104 and into the carrier substrate 108. By cutting down to, but not through, the carrier substrate 108, the singulated through package circuits 121-124 remain attached to carrier substrate 108 until subsequently removed. The singulation cut line separates the conductor layer(s) 111 into first and second signal conduit paths (e.g., 111A, 111B) at each package circuit (e.g., 121). Alternatively, the encapsulated panel of circuit components 102A-D, 104 may be removed from the carrier substrate 108 and then remounted on a dicing tape that is used to hold the panel during saw operations and to hold the subsequent singulated packages formed after saw operations.

Figure 10:
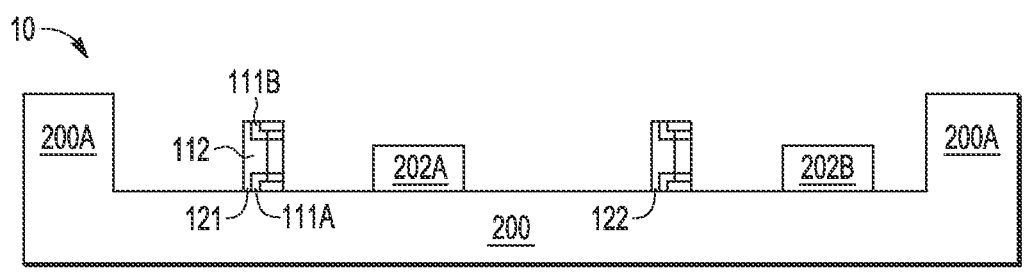
FIGS. 10-18 illustrate cross-sectional views of an example sequence of process steps for assembling and packaging an integrated circuit die with one or more a through package circuits for connecting interconnect structures formed on opposite sides of the package device in accordance with selected embodiments of the present disclosure.

FIG. 10 illustrates a cross-sectional view of a process panel 10 after additional processing is applied to place TPCs 121, 122, and other integrated circuit die 202A, 202B on a carrier substrate 200 in accordance with selected embodiments of the present disclosure. The carrier substrate 200 may be provided as glass holder or panel having a raised outer peripheral frame portion 200A which provides a mold frame function during subsequent processing steps. The previously fabricated TPCs 121, 122 and other integrated circuit die 202A, 202B are placed at predetermined interior positions of the carrier substrate 200 by, for example, a pick and place procedure used in semiconductor package assembly. Though not shown, an adhesive tape or layer may be used to affix the TPCs 121, 122 and other integrated circuit die 20211, 202B to the substrate 200, such as, for example, a double-sided polyimide sticky tape having a silicone adhesive on both sides. The adhesive layer should be of the type that can withstand the packaging processing without becoming brittle or permanently fixed in place, since at a later point in processing the tape will be separated from the package. As illustrated, the TPCs 121, 122 have been formed in a manner that allows for them to be turned on end and dropped into place during the pick and place process along with other components, such as the die 202A, 202B. Positioned on end, the height of each TPC 121, 122 is greater than the height of adjacent integrated circuit die 202A, 202B on the substrate 200 so that each TPC provides a signal conduit path, alone or in combination with an embedded circuit component functionality, past the adjacent integrated circuit die 202A, 202B. As will be appreciated, the assembly of TPCs 121, 122, and other integrated circuit die 202A, 202B may be pre-arranged in a group form or individually, with each TPC and die be attached onto an adhesive tape or layer at the carrier substrate 200.

Figure 11:
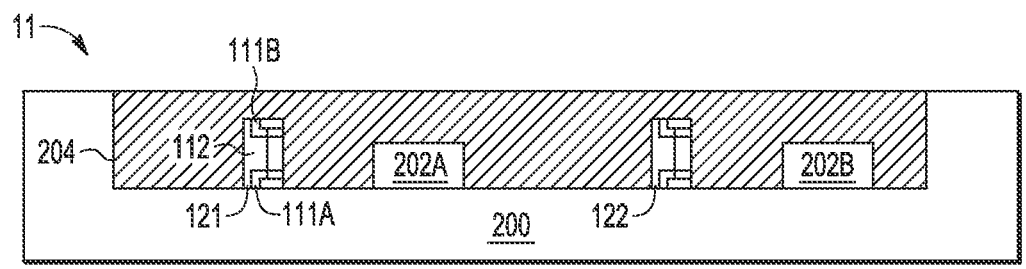

FIG. 11 illustrates a cross-sectional view of the process panel 11 after additional processing is applied to encapsulate the TPCs 121, 122 and other integrated circuit die 202A, 202B in accordance with selected embodiments of the present disclosure. As depicted, a molding material is applied to cover the TPCs 121, 122 and other integrated circuit die 202A, 202B affixed to panel 200, thereby forming an encapsulant or mold compound body 204 that encapsulates the TPCs 121, 122 and other integrated circuit die 202A, 202B within the molding material to form a panel. The molding material can be any appropriate encapsulant including, for example, silica-filled epoxy molding compounds, plastic encapsulation resins, and other polymeric materials such as silicones, polyimides, phenolics, and polyurethanes. The molding material can be applied by a variety of standard processing techniques used in encapsulation including, for example, printing, pressure molding, injection molding, film-assisted molding, and spin application. Once the molding material is applied, the panel can be cured by exposing the materials to certain temperatures for a period of time, or by applying curing agents, or both. In atypical encapsulation process, a depth of encapsulant 204 can exceed a maximum height of the circuit components being embedded, or could be at least the height of the TPCs 121, 122.

Figure 12:
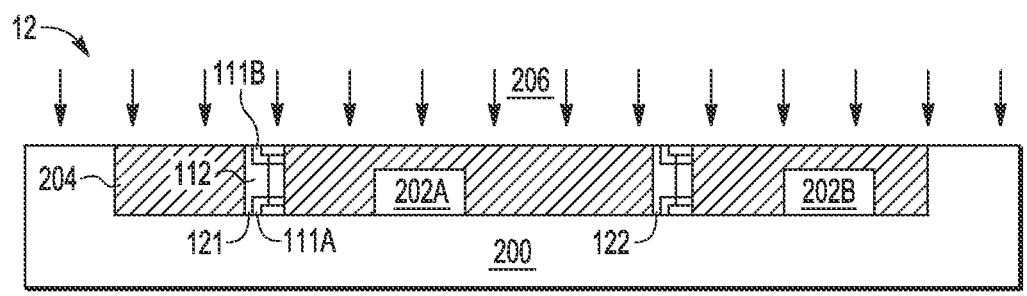

FIG. 12 illustrates a cross-sectional view of the process panel 12 after additional processing is applied to the encapsulated panel 121-122/202A-B/204 to achieve a desired panel thickness in accordance with selected embodiments of the present disclosure. As depicted, a grinding or etching process 206 may be applied to reduce the thickness of the encapsulant or mold compound body 204 to a desired panel thickness to expose the ends of signal conduits (e.g., 111B) in the TPCs (e.g., 121). The reduction in thickness of the encapsulant 104 to expose of the ends of the signal conduits can be performed by a grinding process, chemical etching, laser ablation, or other conventional techniques (e.g., back grinding), or alternatively by forming the encapsulant to the appropriate thickness during the encapsulation process. Though the grinding process 206 is shown as reducing the height of the raised outer peripheral frame portion 200A on the panel 200, this can be readily avoided by removing the raised outer peripheral frame portion 100A or transferring the encapsulated panel of circuit components 121-122/202A-B/204 to another carrier substrate prior to grinding.

Figure 13:
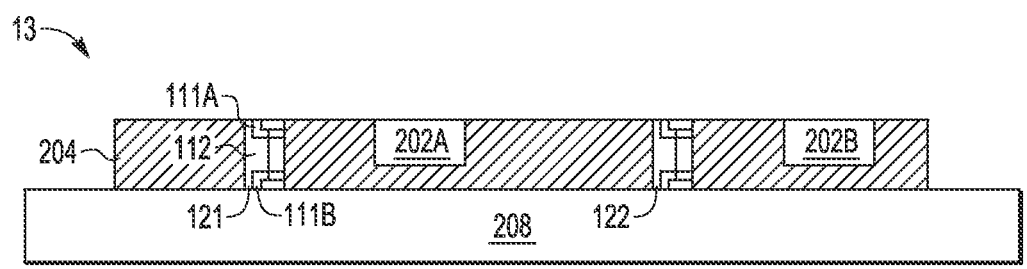

FIG. 13 illustrates a cross-sectional view of the panel of circuit components 13 after additional processing is applied to release, flip, and mount the encapsulated panel of circuit components 121-122/202A-B/204 on a new carrier substrate 208 in accordance with selected embodiments of the present disclosure. As a preliminary step, the encapsulated panel of circuit components 121-122/202A-B/204 is removed or released from the carrier substrate 200. Once released, the side of the panel previously attached to the carrier substrate 200 may be cleaned to remove any adhesive and otherwise clear and expose the ends of any connector terminals (e.g., 111A) on the circuit components 121-122, 202A-B. At this point, the encapsulated panel of circuit components 121-122/202A-B/204 is turned over or flipped and attached or mounted to a new process carrier substrate or holder or panel 208 using any appropriate attach method. As mounted, the connector terminals (e.g., 111A) for the TPCs 121, 122 and other integrated circuit die 202A, 202B are exposed on a top surface of the encapsulated panel of circuit components 121-122/202A-B/204.

Figure 14:
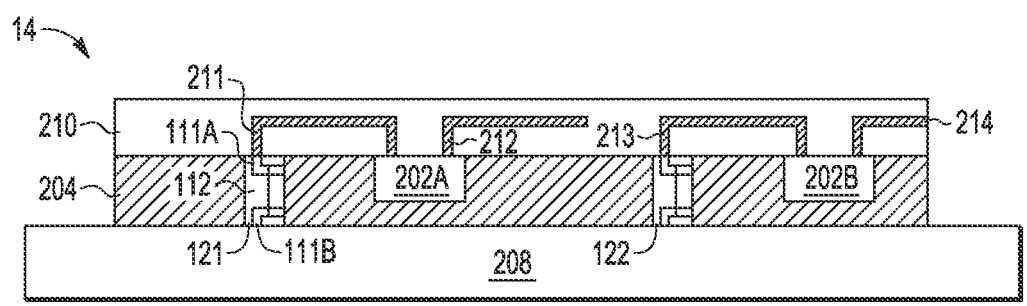

FIG. 14 illustrates a cross-sectional view of the panel of circuit components 14 after additional processing is applied to build up an interconnect structure 210-214 on a first exposed surface of the encapsulated panel of circuit components 121-122/202A-B/204 in accordance with selected embodiments of the present disclosure. While the interconnect structure 210-214 may be formed with any desired combination of dielectric or insulator layers and patterned conductor layers, in selected embodiments, a first or top exposed surface of the encapsulated panel is covered with one or more insulating layers 210, such as by depositing a first insulating layer (e.g., spin coating a polymeric or epoxy resin dielectric layer) that is patterned and selectively etched or developed to form openings exposing connector terminals (e.g., 111A) in the TPCs 121, 122 and other integrated circuit die 202A, 202B. Over the patterned first insulating layer, one or more conductive layers may be deposited to form an interconnect conductor which is patterned and selectively etched to form the conductor layers 211-214 that provide one or more signal conduits to and from the embedded TPCs 121, 122, and other integrated circuit die 202A, 202B. As will be appreciated, one or more additional insulating layers 210 may be formed, patterned, and etched during fabrication of the conductor layers 211-214 as required by the application. By forming the interconnect structure 210-214 over the panel of circuit components with a planar fabrication techniques, plated metallization layers can be formed to connect each integrated circuit die (e.g., 202A) to a corresponding embedded circuit component (e.g., 121) with a fine pitch patterned conductor layer (e.g., 111), and to provide one or more additional signal conduits (e.g., 212) to the encapsulated circuit components (e.g., 202A). However, in other embodiments, the interconnect structure 210-214 may be formed to connect an embedded circuit component to bypass a corresponding embedded circuit component so that there is no electrical connection, depending on the application.

Figure 15:
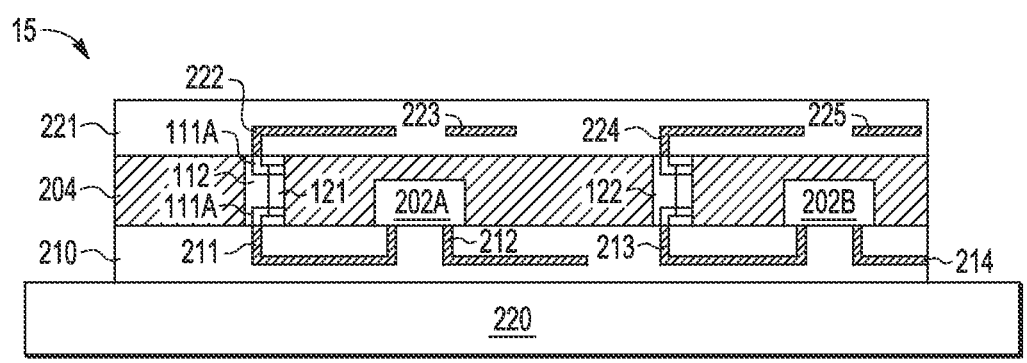

FIG. 15 illustrates a cross-sectional view of the panel of circuit components 15 after additional processing is applied to build up an interconnect structure 221-225 on a second exposed top surface of the encapsulated panel of circuit components in accordance with selected embodiments of the present disclosure. As a preliminary step, the encapsulated panel and interconnect structure 210-214 is removed or released from the carrier substrate 208 and the side of the panel previously attached to the carrier substrate 208 is cleaned before being turned over or flipped and attached or mounted to a new process carrier substrate or holder or panel 220 using any appropriate attach method. As mounted, the connector terminals (e.g., 111B) for the TPCs 121, 122 are exposed on the second exposed top surface of the encapsulated panel. On the second exposed top surface, the interconnect structure 221-225 may be formed with any desired combination of dielectric or insulator layers and patterned conductor layers. For example, the second top exposed surface of the panel of circuit components may be covered with one or more insulating layers 221, such as by depositing a second insulating layer (e.g., spin coating a polymeric or epoxy resin dielectric layer) that is patterned and selectively etched or developed to form openings exposing the connector terminals (e.g., 111B) in the TPCs 121, 122. Over the patterned second insulating layer, one or more conductive layers may be deposited to form an interconnect conductor which is patterned and selectively etched to form the conductor layers 222-225 that provide one or more signal conduits to and from the embedded TPCs 121, 122 and other integrated circuit die 202A, 202B. As will be appreciated, one or more additional insulating layers 221 may be formed, patterned, and etched during fabrication of the conductor layers 222-225 as required by the application. By forming the interconnect structure 221-225 over the panel of circuit components with a planar fabrication techniques, plated metallization layers can be formed which connect to each embedded circuit component (e.g., 121) with a fine pitch patterned conductor layer (e.g., 222), and to provide one or more additional signal conduits (e.g., 223) which may also connect to the encapsulated integrated circuit die components (e.g., 202A).

Figure 16:
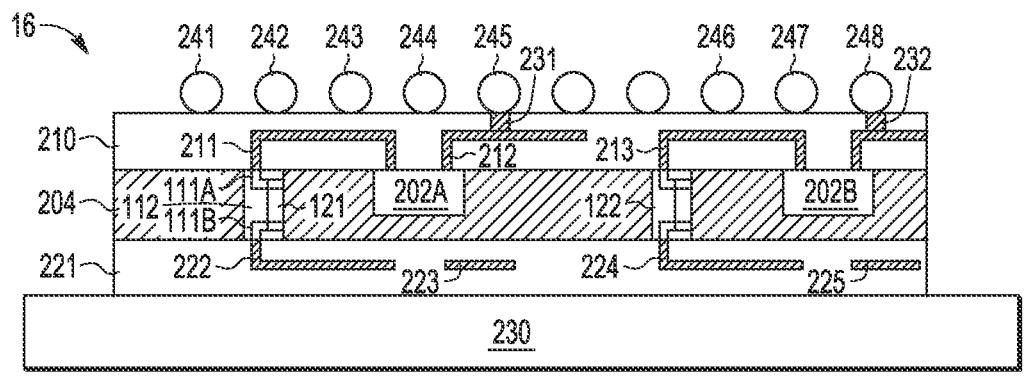

FIG. 16 illustrates a cross-sectional view of the encapsulated panel of circuit components 16 after additional processing is applied to form bail grid array conductors 241-248 in accordance with selected embodiments of the present disclosure. As depicted, ball grid array conductors 241-248 are shown as being formed on the exposed surface of the encapsulated panel to be electrically connected via conductive traces (e.g., 231, 232) formed in the interconnect structure 210-214 to the integrated circuit die 202A, 202B, though it will be appreciated that selected ball grid array conductors 241-248 may be electrically connected through conductive traces (not shown) to the embedded TPCs 121, 122. As a preliminary step, the encapsulated panel may be released, cleaned, flipped, and mounted to a new carrier substrate 230 if desired. On the exposed interconnect structure (e.g., 210-214), the exposed insulating layer (e.g., 210) can be patterned and etched for forming via openings which expose one or more of the conductor layers 211-214. In the via openings, one or more conductive layers may be formed to provide conductive via structures 231, 232, such as by depositing and patterning a conductive metal, metal alloy, aluminum, copper, tantalum, titanium, tungsten, or any metal alloy, nitride or silicide. Subsequently, a plurality of conductive ball connectors 241-248 may be positioned and formed on the exposed surface of the interconnect structure 210-214 using standard techniques and materials to be electrically connected through the conductive via structures (e.g., 231, 232) to the embedded integrated circuit die components (e.g., 202A, 202B) and/or TPCs 121, 122. Alternatively, the conductive via structures 231, 232) may be formed during build-up of the dielectric and metal layers forming the exposed interconnect structure 210-214. For example, in the interconnect structure 210-214 shown in FIG. 14, openings to the metal layer 214 may be formed in the outermost dielectric layer 210 and filled with one or more conductive via fill layers. In selected embodiments, an array of solder balls 241-248 may be attached to conductive via structures formed in the interconnect structure 210-214 for making electrical connection to the TPCs 121, 122 and other integrated circuit die 202A, 202B.

Figure 17:
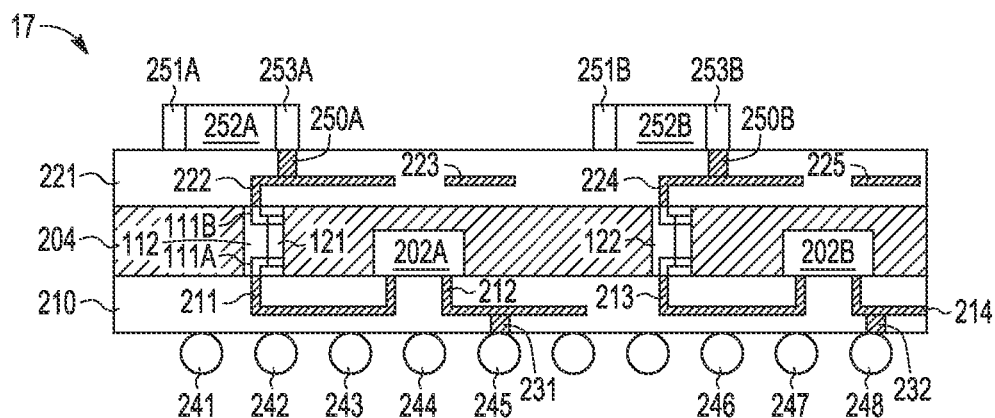

FIG. 17 illustrates a cross-sectional view of the encapsulated panel, of circuit components 17 after additional processing is applied to form surface mount devices or circuits 252A, 252B in accordance with selected embodiments of the present disclosure. As depicted, each surface mount device (e.g., 252A) may be a circuit component which includes one or more connector terminals (e.g., 251A, 253A), such that the surface mount devices 252A, 252B may be any type of circuit, such as a capacitor, resistor, inductor, or other passive device, and may also include one or more active circuit components, such as one or more switching transistors or more complex circuits that perform any other type of function. Thus, the surface mount devices 252A, 2521 are not limited to a particular technology. In selected embodiments, surface-mount technology (SMT) methods are used to mount or place circuit components 252A, 252B directly onto the exposed opposing surface of the encapsulated panel to be electrically connected via conductive traces (e.g., 250A, 250B) formed in the interconnect structure 221-225 to the embedded TPCs 121, 122, though it will be appreciated that selected surface mount devices may be electrically connected through conductive traces (not shown) to the embedded integrated circuit die components (e.g., 202A, 202B). To attach the surface mount devices 252A, 252B on the exposed opposing surface of the interconnect structure (e.g., 221-225), the exposed insulating layer (e.g., 221) can be patterned and etched for form via openings which expose one or more of the conductor layers 222-225. In the via openings, one or more conductive layers may be formed to provide conductive via structures 250A, 250B, such as by depositing and patterning a conductive metal, metal alloy, or combinations thereof as known in the art. Subsequently, a plurality of surface mount devices 252A, 252B may be positioned and attached on the exposed surface of the interconnect structure 221-225 using standard techniques and materials so that the connector terminals (e.g., 253A, 253B) are electrically connected through the conductive via structures (e.g., 250A, 250B) to the embedded TPCs 121, 122 and/or integrated circuit die components (e.g., 202A, 202B).

Figure 18:
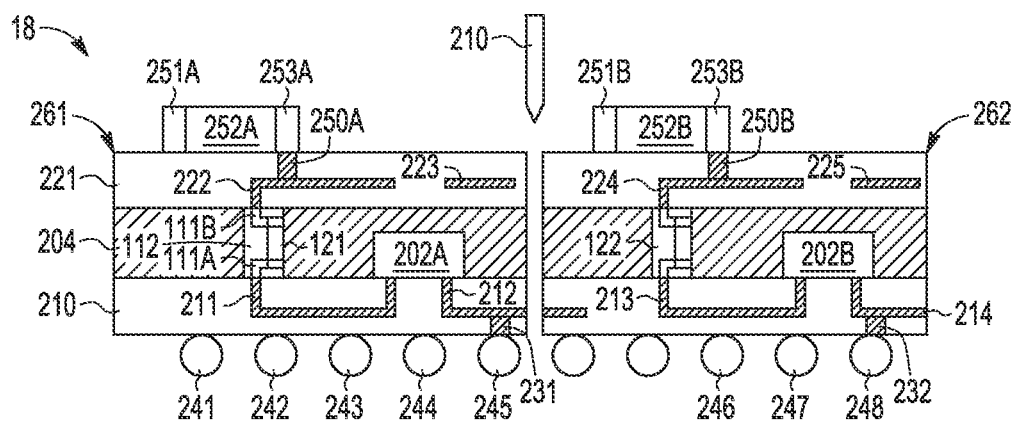

FIG. 18 illustrates a cross-sectional view of the panel of circuit components 18 after additional processing is applied to singulate the panel into individual packaged devices 261, 262 in accordance with selected embodiments of the present disclosure. As will be appreciated, individual packaged devices 261, 262 may be singulated with a saw or laser or other cutting device 254 that is applied along defined saw cut lines or scribe grids (not shown) to cut down through encapsulated panel of circuit components 18. The illustrated packaged devices (e.g., 261) are shown as including a circuit connection path from the surface mount device 252A) through the patterned conductors (e.g., 250A, 222) in the interconnect structure (e.g., 221-225) to the embedded circuit component (e.g., 121) and through the patterned conductors (e.g., 211) in the interconnect structure (e.g., 210-214) to the embedded IC die (e.g., 202A) before proceeding through the patterned conductors (e.g., 212, 231) in the interconnect structure 210-214 to the ball conductor 245). However, it will be appreciated that any desired circuit connection path may be formed in the packaged devices which may or may not include the surface mount devices and/or ball grid array conductors.

Figure 19:
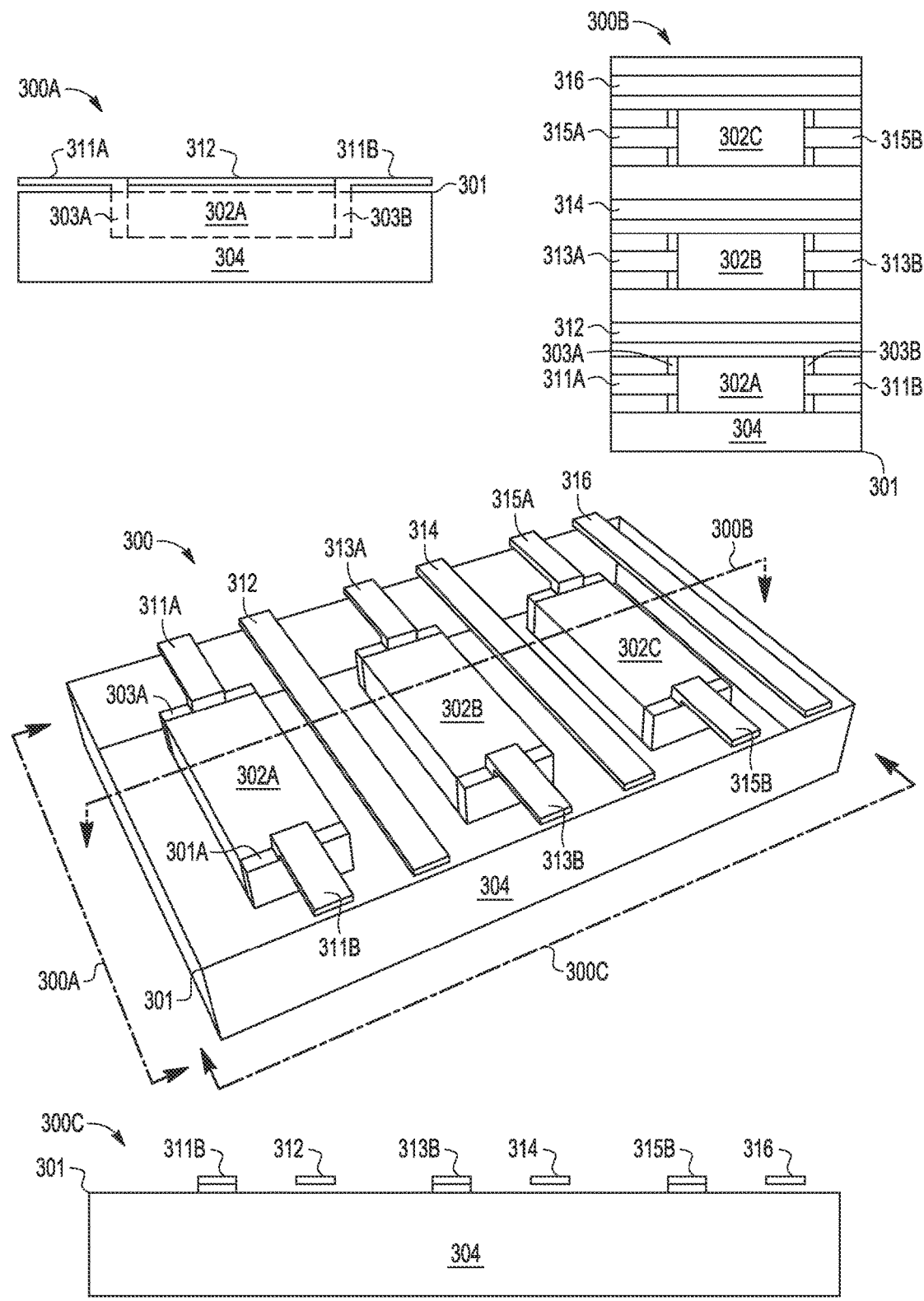
FIG. 19 illustrates different views of a panel of through package circuits with embedded components in accordance with selected embodiments of the present disclosure.

To provide additional example details of selected embodiments of the present disclosure, reference is now to FIG. 19 which shows perspective, side, and top views of an encapsulated panel of through package circuits 301 with embedded components 302A-C in accordance with selected embodiments of the present disclosure. As illustrated with the perspective view 300, the encapsulated panel 301 includes an encapsulant mold compound body 304 in which a plurality of circuit components 302A-C are embedded, where each circuit component (e.g., 302A) may include one or more connector terminals (e.g., 301A, 303A), and may embody any type of active or passive circuit element. The embedded positioning of the circuit components 302A-C within the encapsulant mold compound body 304 is shown most clearly with the end view 300A. The encapsulated panel 301 also includes fine pitch patterned conductor layers 311A/B, 313A/B, 315A/B which are formed to make electrical connection to the connector terminals of the embedded components 302A-C, For example, first and second patterned conductor layers 311A, 311B are connected, respectively, to the connector terminals 303A, 301A of the embedded component 302A. In similar fashion, patterned conductor layers 313A, 313B are connected, respectively, to the connector terminals of the embedded component 302B, while patterned conductor layers 315A, 315B are connected, respectively, to the connector terminals of the embedded component 302C. If desired, the encapsulated panel 301 may also include fine pitch patterned conductor layers 312, 314 which are interleaved and positioned between the embedded components 302A-C so as to extend across the entire width of the through package circuit panel 301. The relative positioning of the circuit components 302A-C and interleaved fine pitch patterned conductor layers 312, 314 is shown with the top view 300B and side view 300C. While the side view 300C shows the fine pitch patterned conductor layers 311-316 as being elevated above the encapsulant mold compound body 304, it will be appreciated that the patterned conductor layers 311-316 my be formed in and surrounded by one or more insulating layers (not shown).

Figure 20:
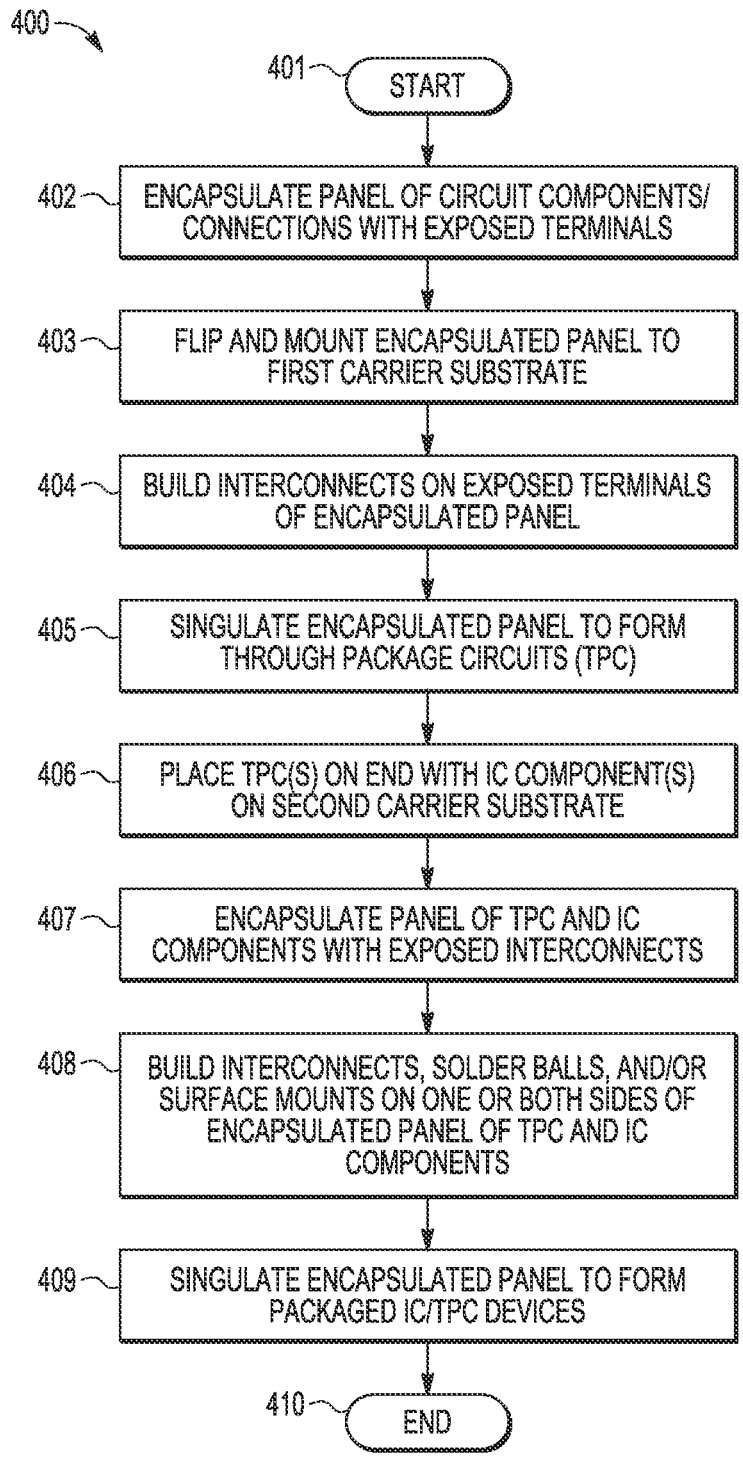
FIG. 20 illustrates a simplified flow chart of a method for fabricating integrated circuit package devices having a through package circuit in accordance with selected embodiments of the present disclosure.

Turning now to FIG. 20, there is illustrated a simplified flow chart example sequence 400 depicting a process of fabricating integrated circuit package devices having a through package circuit in accordance with selected embodiments of the present disclosure. After the process begins (at step 401), one or more circuit components and/or connections are encapsulated in a first panel at step 402, such as by using a pick-and-place-machine to place a plurality of circuit component chips (e.g., active or passive circuit components) onto a glass substrate using an adhesive layer or other die attach mechanism. At the attachment face with the glass substrate, the circuit components may each include at least one contact terminal for making electrical connection to the circuit component. And by covering or encapsulating circuit components with a suitable encapsulant material, such as an epoxy molding compound which is cured to form a mold compound body that covers the circuit components, the encapsulated first panel is formed. If desired, the encapsulated first panel may be thinned to a desired thickness by back-grinding the top of the panel. At step 403, the encapsulated first panel is removed from the glass substrate, cleaned, flipped, and mounted to a first carrier substrate, such as a process carrier or other suitable substrate, using any desired attachment or adhesive mechanism. At step 404, a conductive interconnect structure is built on top of the encapsulated first panel to make electrical contact with exposed contact terminals of the circuit components, such as by sequentially depositing, patterning, etching insulating layers and conductive layers (e.g., plated copper) to form fine pitched plated conductor lines. At step 405, the encapsulated first panel may be singulated into individual through package circuits (TPCs), such as by using saw singulation, thereby exposing fine pitched plated conductor lines at the sides of each TPC. At step 406, one or more individual TPC components are rotated "on end" and placed with other passive and active components on a second carrier substrate, such as by using a pick-and-place-machine to place the TPC component(s) and IC die onto a panel using an adhesive layer or other die attach mechanism. The TPC component(s) and IC die are placed on the second carrier substrate with a sufficient spacing in order to allow a fan-out of the electrical contacts as will be explained later. In addition, each TPC component is placed on end so that the exposed fine pitched plated conductor lines at the sides of each TPC component are located at the bottom and top of the TPC component. At step 407, the TPC component(s) and IC die are covered or encapsulated with a suitable encapsulant material, such as an epoxy molding compound which is cured to form a mold compound body, thereby forming an encapsulated second panel. Either by controlling the thickness of the mold compound body or by thinning the mold compound body with back-grinding, the encapsulated second panel is thinned to a desired thickness to expose the fine pitched plated conductor lines on the top of the TPC component(s). At step 408, conductive interconnect structures are built on one or both sides of the encapsulated second panel to make electrical contact with exposed contact terminals of TPC component(s) and IC die, such as by sequentially depositing, patterning, etching insulating layers and conductive layers (e.g., plated copper) to form fine pitched plated conductor lines. In addition or in the alternative, conductive ball connectors (e.g., solder balls) and/or surface mount devices may be mounted or attached to on one or both sides of the encapsulated second panel to make electrical contact with exposed contact terminals of the TPC component(s) and IC die. Finally, the encapsulated second panel may be singulated into individual packaged IC/TPC device (step 409), such as by using mechanical saws, lasers, or other appropriate means. At this point, the individual packaged IC/TPC device may be placed in a tray and sent for inspection, testing, and laser marking. The process ends at step 410.

By now it should be appreciated that there is provided herein a method and apparatus for packaging an electronic device. In the disclosed methodology, a through package circuit device is provided that includes an embedded circuit component encased at least in part in a molded package with conductor terminals extending from the embedded circuit component to each side of the molded package. In selected embodiments, the through package circuit device is provided by embedding the circuit component as an active or passive device (e.g., transistor, capacitor, inductor, or resistor) in an epoxy mold compound with conductor terminals extending from the active or passive device to each side of the molded package. If desired, a portion of the molded package may be removed by grinding or laser ablating the epoxy mold compound to a predetermined depth so that the embedded circuit component is still covered by the molded package. In other embodiments, the through package circuit device is provided by releasably attaching a plurality of circuit components to a panel substrate; encapsulating the plurality of circuit components with an epoxy mold compound to form a molded package having a first major surface covering the plurality of circuit components and a second major surface exposing contact terminals for the plurality of circuit components; and forming a first interconnect structure on the second major surface of the molded package using one or more photolithographic processes to form the conductor terminals as plated conductors extending from the embedded circuit component to each side of the molded package. When formed as a panel, the molded package and first interconnect structure may be singulated into a plurality of through package circuit devices. In a first area of a holder or glass substrate, the through package circuit device is placed on end so that the conductor terminals are positioned and exposed on first and second opposed surfaces of the through package circuit device. In addition, a first electronic device is placed in a second area of the holder. On the holder, a molded device package is formed which covers the first electronic device and encapsulates the through package circuit device and the first electronic device while leaving exposed one or more of the exposed conductor terminals positioned on the first surface of the through package circuit device, Where the conductor terminals and embedded circuit component form a circuit path through the molded device package. In selected embodiments, the molded device package may be formed by embedding the through package circuit device and the first electronic device in an epoxy mold compound to form the molded device package which covers the first through package circuit device and the first electronic device; and removing a portion of the molded device package by grinding or laser ablating the epoxy mold compound to a predetermined depth which exposes one or more of the exposed conductor terminals positioned on the first surface of the through package circuit device. On a first major surface of the molded device package, a first interconnect structure may be formed using one or more photolithographic processes to form plated conductor lines coupled to the exposed conductor terminals positioned on the first surface of the through package circuit device. On a second opposed major surface of the molded device package, a second interconnect structure may be formed using one or more photolithographic processes to form plated conductor lines coupled to exposed conductor terminals positioned on the second, opposed surface of the through package circuit device.

In another form, there is provided a packaged electronic device and associated fabrication method. In the disclosed methodology, a panel of circuit components is encapsulated in a molded package with exposed terminals extending from each circuit component to a first side of the molded package. In selected embodiments, the panel of circuit components includes a plurality of circuits encapsulated in the molded package, where each circuit in the plurality of circuits is selected from a group consisting of a conductive trace layer, an active device, or a passive device (e.g., a capacitor, inductor, resistor, or diode). In selected embodiments, the panel of circuit components is encapsulated by releasably attaching a plurality of circuit components to a panel substrate, and encapsulating the plurality of circuit components with an epoxy mold compound to form the molded package where the first side of the molded package exposing the terminals from each circuit component. On the exposed first side of the molded package, a first interconnect structure is built which includes planar conductor layers for electrical connection to the exposed terminals, thereby forming an encapsulated interconnect panel. In selected embodiments, the first interconnect structure is built by forming the planar conductor layers in one or more insulator layers formed on the first side of the molded package using one or more photolithographic processes to deposit, pattern, and etch plated conductor layers. Subsequently, the encapsulated interconnect panel is singulated to form a plurality of through package circuit devices, each including an embedded circuit component encased at least in part in a molded package housing and electrically connected across the exposed terminals and planar conductor layers extending to opposed first and second sides of the molded package housing. On a carrier substrate, the plurality of through package circuit devices are attached having a perpendicular orientation, and a plurality of second integrated circuit components are attached having a parallel orientation. Subsequently, the plurality of through package circuit devices and the plurality of second integrated circuit components are encapsulated in a second molded package to leave exposed at each through package circuit device the planar conductor layers extending to opposed first and second sides of the molded package housing. In selected embodiments, the through package circuit devices and second integrated circuit components are encapsulated in the second molded package by embedding the plurality of through package circuit devices and the plurality of second integrated circuit components in an epoxy mold compound to form the second molded package which covers the plurality of through package circuit devices and the plurality of second integrated circuit components; and removing a portion of the second molded package by grinding or laser ablating the epoxy mold compound to a predetermined depth which exposes one or more of the exposed terminals extending from each circuit component to the first side of the molded package. On at least a first surface of the second molded package, a second interconnect structure is built for electrical connection to the planar conductor layers extending to opposed first and second sides of the molded package housing to form an encapsulated panel of through package circuit (TPC) devices and integrated circuit (IC) components. In selected embodiments, the second interconnect structure is built by forming atop interconnect structure on a first major surface of the second molded package using one or more photolithographic processes to form plated conductor lines that are electrically coupled to the planar conductor layers extending to the first major surface of the second molded package; and forming a bottom interconnect structure on a second, opposed major surface of the second molded package using one or more photolithographic processes to form plated conductor lines that are electrically coupled to the planar conductor layers extending to the second, opposed major surface of the second molded package. In other embodiments, the second interconnect structure is built by forming a top interconnect structure on a first major surface of the second molded package using one or more photolithographic processes to form plated conductor lines that are electrically coupled to the planar conductor layers extending to the first major surface of the second molded package; and forming a conductive electromagnetic shield layer on a second, opposed major surface of the second molded package that is electrically coupled to the planar conductor layers extending to the second, opposed major surface of the second molded package. In addition, ball grid array conductors are formed on a first surface of the encapsulated panel of through package circuit devices and integrated circuit components for electrical connection via conductive traces to the through package circuit devices and integrated circuit components. In addition, the encapsulated panel of through package circuit devices and integrated circuit components may be singulated to form one or more packaged TPC/IC devices.

In yet another form, there is provided a packaged device assembly and associated method of fabrication. In the disclosed packaged device assembly, an integrated circuit die and a through package circuit device are encased at least in part in a molded package having first and second opposed major surfaces with the through package circuit device oriented perpendicularly to the integrated circuit die to provide an interconnect path between the first and second opposed major surfaces of the molded package, where through package circuit device comprises one or more planar conductor layers that are oriented in a plane that is perpendicular to a planar orientation of the integrated circuit die and that are electrically connected to an embedded circuit selected from a group consisting of a conductive trace layer, an active device, or a passive device. In addition, the packaged device assembly may include an interconnect structure formed on a first major surface of the molded package comprising planar conductor layers for electrically connecting the integrated circuit die to the through package circuit device.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross-sectional drawings and flow charts illustrating process and structural details of a packaged IC/TPC device and associated fabrication process without including every device feature or aspect in order to avoid limiting or obscuring the present invention. Such descriptions and representations are used by those skilled in the art to describe and convey the substance of their work to others skilled in the art, and the omitted details which are well known are not considered necessary to teach one skilled in the art of how to make or use the present invention. In addition, certain elements in the figures are illustrated for simplicity and clarity and have not necessarily been drawn to scale. It is also noted that, throughout this detailed description, certain layers of materials will be deposited, removed and otherwise processed to form the depicted integrated circuit die and associated packaging structures. Where the specific procedures for forming such layers are not detailed below, conventional techniques to one skilled in the art for depositing, removing or otherwise forming such layers at appropriate thicknesses shall be intended. Such details are well known and not considered necessary to teach one skilled in the art of how to make or use the present invention.

Although the described exemplary embodiments disclosed herein are directed to various integrated circuit package devices with through package circuits and methods for manufacturing same, the present invention is not necessarily limited to the example embodiments which illustrate inventive aspects of the present invention that are applicable to a wide variety of packaged integrated circuit devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the through package circuits are described with reference to embedded components, such as capacitors, resistors, inductors, diodes, and other passive devices, though active devices may also be included as embedded components when forming the through package circuits, so these are merely exemplary circuits presented to provide a useful reference in discussing various aspects of the invention, and is not intended to be limiting so that persons of skill in the art will understand that the principles taught herein apply to other types of devices. For example, selected embodiments may implement the integrated circuit package device with a single through package circuit, or with a plurality of through package circuits formed in a single device, alone or in combination with through package connection traces or conductors for routing signal or voltages across and/or through the through package circuit(s). Furthermore, those skilled in the art will recognize that disclosed packaged integrated circuit devices may be implemented with one or more integrated circuits formed on a lead frame assembly, or with other integrated circuit arrangements or assemblies, and is also applicable to any one of numerous package devices that include an encapsulating package formed to protect integrated die mounted on a die flag. In addition, the methodology of the present invention may be applied using materials other than expressly set forth herein. In addition, the process steps may be performed in an alternative order than what is presented. For example, the disclosed sequence of building up interconnect structures on the encapsulated through package circuit and die may be reversed or changes. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. In addition, the term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for packaging an electronic device, comprising:
    placing a through package circuit device on end in a first area of a holder so that conductor terminals of the through package circuit device are positioned and exposed on first and second opposed surfaces of the through package circuit device, wherein prior to the placing, the through package circuit device comprises an embedded circuit component encased at least in part in a molded package with the conductor terminals extending from the embedded circuit component to each side of the molded package;
    placing a first electronic device in a second area of the holder; and
    forming a molded device package which covers the first electronic device and encapsulates the through package circuit device and the first electronic device while leaving exposed one or more of the exposed conductor terminals positioned on the first surface of the through package circuit device, where the conductor terminals and embedded circuit component form a circuit path through the molded device package.

2. The method of claim 1, where providing the through package circuit device comprises embedding the circuit component as an active or passive device in an epoxy mold compound with conductor terminals extending from the active or passive device to each side of the molded package.

3. The method of claim 2, further comprising removing a portion of the molded package by grinding or laser ablating the epoxy mold compound to a predetermined depth so that the embedded circuit component is still covered by the molded package.

4. The method of claim 2, where the passive device is selected from a group consisting of a capacitor, inductor, resistor, or diode.

5. The method of claim 1, where providing the through package circuit device comprises:
    releasably attaching a plurality of circuit components to a panel substrate;
    encapsulating the plurality of circuit components with an epoxy mold compound to form a molded package having a first major surface covering the plurality of circuit components and a second major surface exposing contact terminals for the plurality of circuit components; and forming a first interconnect structure on the second major surface of the molded package using one or more photolithographic processes to form the conductor terminals as plated conductors extending from the embedded circuit component to each side of the molded package.

6. The method of claim 5, further comprising singulating molded package and first interconnect structure into a plurality of through package circuit devices.

7. The method of claim 1, further comprising:
forming a first interconnect structure on a first major surface of the molded device package using one or more photolithographic processes to form plated conductor lines coupled to the exposed conductor terminals positioned on the first surface of the through package circuit device; and forming a second interconnect structure on a second, opposed major surface of the molded device package using one or more photolithographic processes to form plated conductor lines coupled to exposed conductor terminals positioned on the second, opposed surface of the through package circuit device.

8. The method of claim 1, where forming the molded device package comprises:
embedding the through package circuit device and the first electronic device in an epoxy mold compound to form the molded device package which covers the first through package circuit device and the first electronic device; and removing a portion of the molded device package by grinding or laser ablating the epoxy mold compound to a predetermined depth which exposes one or more of the exposed conductor terminals positioned on the first surface of the through package circuit device.

9. A method, comprising:
encapsulating a panel of circuit components in a molded package with exposed terminals extending from each circuit component to a first side of the molded package;

building a first interconnect structure on the exposed first side of the molded package comprising planar conductor layers for electrical connection to the exposed terminals to form an encapsulated interconnect panel;

singulating the encapsulated interconnect panel to form a plurality of through package circuit devices, each comprising an embedded circuit component encased at least in part in a molded package housing and electrically connected across the exposed terminals and planar conductor layers extending to opposed first and second sides of the molded package housing;

attaching to a carrier substrate the plurality of through package circuit devices having a perpendicular orientation and a plurality of second integrated circuit components having a parallel orientation;

encapsulating the plurality of through package circuit devices and the plurality of second integrated circuit components in a second molded package to leave exposed at each through package circuit device the planar conductor layers extending to opposed first and second sides of the molded package housing; and building a second interconnect structure on at least a first surface of the second molded package for electrical connection to the planar conductor layers extending to opposed first and second sides of the molded package housing to form an encapsulated panel of through package circuit (TPC) devices and integrated circuit (IC) components.

10. The method of claim 9, further comprising forming ball grid array conductors on a first surface of the encapsulated panel of through package circuit devices and integrated circuit components for electrical connection via conductive traces to the through package circuit devices and integrated circuit components.

11. The method of claim 9, further comprising singulating the encapsulated panel of through package circuit devices and integrated circuit components to form one or more packaged TPC/IC devices.

12. The method of claim 9, where the panel of circuit components comprises a plurality of circuits encapsulated in the molded package, where each circuit in the plurality of circuits is selected from a group consisting of a conductive trace layer, an active device, or a passive device.

13. The method of claim 12, where the passive device is selected from a group consisting of a capacitor, inductor, resistor, or diode.

14. The method of claim 9, where encapsulating the panel of circuit components comprises:
releasably attaching a plurality of circuit components to a panel substrate; and encapsulating the plurality of circuit components with an epoxy mold compound to form the molded package where the first side of the molded package exposing the terminals from each circuit component.

15. The method of claim 9, where building the first interconnect structure comprises forming the planar conductor layers in one or more insulator layers formed on the first side of the molded package using one or more photolithographic processes to deposit, pattern, and etch plated conductor layers.

16. The method of claim 9, where building the second interconnect structure comprises:
forming a top interconnect structure on a first major surface of the second molded package using one or more photolithographic processes to form plated conductor lines that are electrically coupled to the planar conductor layers extending to the first major surface of the second molded package; and forming a bottom interconnect structure on a second, opposed major surface of the second molded package using one or more photolithographic processes to form plated conductor lines that are electrically coupled to the planar conductor layers extending to the second, opposed major surface of the second molded package.

17. The method of claim 9, where building the second interconnect structure comprises:
forming a top interconnect structure on a first major surface of the second molded package using one or more photolithographic processes to form plated conductor lines that are electrically coupled to the planar conductor layers extending to the first major surface of the second molded package; and forming a conductive electromagnetic shield layer on a second, opposed major surface of the second molded package that is electrically coupled to the planar conductor layers extending to the second, opposed major surface of the second molded package.

18. The method of claim 9, where encapsulating the plurality of through package circuit devices and the plurality of second integrated circuit components in a second molded package comprises:

embedding the plurality of through package circuit devices and the plurality of second integrated circuit components in an epoxy mold compound to form the second molded package which covers the plurality of through package circuit devices and the plurality of second integrated circuit components; and removing a portion of the second molded package by grinding or laser ablating the epoxy mold compound to a predetermined depth which exposes one or more of the exposed terminals extending from each circuit component to the first side of the molded package.

19. A packaged device assembly comprising:

an integrated circuit die and a through package circuit device encased at least in part in a molded package having first and second opposed major surfaces with the through package circuit device oriented perpendicularly to the integrated circuit die to provide an interconnect path between the first and second opposed major surfaces of the molded package, where through package circuit device comprises one or more planar conductor layers that are oriented in a plane that is perpendicular to a planar orientation of the integrated circuit die and that are electrically connected to an embedded circuit selected from a group consisting of a conductive trace layer, an active device, or a passive device, wherein the through package circuit device includes a second molded package, wherein the embedded circuit is encased at least in part in the second molded package.

20. The packaged device assembly of claim 19, further comprising an interconnect structure formed on a first major surface of the molded package comprising planar conductor layers for electrically connecting the integrated circuit die to the through package circuit device.

* * * * *